United States Patent
Lee

(10) Patent No.: US 7,491,913 B2
(45) Date of Patent: Feb. 17, 2009

(54) BAKE APPARATUS FOR USE IN SPIN-COATING EQUIPMENT

(75) Inventor: Myoung-Kuy Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 574 days.

(21) Appl. No.: 11/095,554

(22) Filed: Apr. 1, 2005

(65) Prior Publication Data

US 2005/0244759 A1  Nov. 3, 2005

(30) Foreign Application Priority Data

Apr. 30, 2004  (KR) .................. 10-2004-0030370

(51) Int. Cl.
*F27B 5/14* (2006.01)
*C23C 16/00* (2006.01)

(52) U.S. Cl. .................. 219/390; 219/405; 219/411; 219/444.1; 392/386; 392/388; 392/416; 392/418; 118/715; 118/723 VE; 118/724; 118/725; 118/728; 118/729; 118/733

(58) Field of Classification Search ............... 219/390, 219/405, 411, 444.1; 392/386, 388, 416, 392/418; 118/715–6, 723 VE, 724–9, 733
See application file for complete search history.

(56) References Cited

U.S. PATENT DOCUMENTS

| 5,916,631 | A | 6/1999 | Mahneke |
| 6,185,370 | B1 | 2/2001 | Sekimoto et al. |
| 2002/0098283 | A1 | 7/2002 | Gurer et al. |
| 2005/0003600 | A1* | 1/2005 | Kasai et al. .................. 438/200 |

* cited by examiner

*Primary Examiner*—Shawntina Fuqua
(74) *Attorney, Agent, or Firm*—Volentine & Whitt, PLLC

(57) ABSTRACT

Bake apparatus for use in baking a substrate, such as a semiconductor wafer, includes a chamber, a hot plate installed within the chamber, and first and second buffer plates for uniformly dispersing hot gas. The hot plate is configured to support the semiconductor wafer. The gas is injected into the chamber through an air passageway and is exhausted through an air exhaust opening. The first buffer plate is disposed within an upper part of the chamber so as to uniformly disperse the gas within the chamber. The second buffer plate is disposed above the first buffer plate. The first and second buffer plates each have a number of discharge holes by which the gas is uniformly discharged from the chamber to the exhaust opening.

6 Claims, 1 Drawing Sheet

BAKE APPARATUS FOR USE IN SPIN-COATING EQUIPMENT

BACKGROUND OF THE INVENTION

1. Field of the Invention

The present invention relates to the manufacturing of semiconductor devices and the like. More specifically, the present invention relates to bake apparatus for baking a substrate, such as a semiconductor wafer, coated with photoresist.

2. Description of the Related Art

Semiconductor devices are generally manufactured by subjecting a substrate, e.g., a wafer, to ion implantation, deposition, diffusion, photolithography and etching processes. The aim of these processes, especially the photolithography process, is to form a desired pattern on the wafer.

The photolithography process includes coating, exposing and developing processes. In the coating process, the photoresist is dispensed onto the wafer and the wafer is rotated at a high speed so that the wafer is covered with a layer of photoresist to a desired thickness. In the exposure process, the wafer covered with the photoresist and a corresponding mask or reticle are aligned with each other. Then, the layer of photoresist is irradiated with light, such as ultraviolet light, through the mask or reticle so as to transfer a pattern of the mask or reticle to the layer of photoresist. In the developing process, the exposed layer of photoresist is developed to form a desired photoresist pattern. More specifically, either the exposed or non-exposed portion of the layer of photoresist is removed by a developing solution whereby the layer of photoresist is patterned.

In the etching process, a target layer(s) underlying the photoresist pattern is etched using the photoresist pattern as an etch mask. As a result, the target layer(s) is/are patterned.

The photolithography process additionally includes an HMDS(Hexamethyl disilane) process and one or more bake processes. The HMDS process is performed to improve the adhesion of the photoresist to the wafer. A bake process may be performed to remove moisture or an organic solvent from the wafer before the wafer is coated with the photoresist. Also, a bake process may be performed after the wafer has been coated with the photoresist to remove solvent from the photoresist.

A chamber-type of bake apparatus is used to perform the bake process. The bake apparatus includes a chamber, and a hot plate disposed within the chamber. A wafer coated with the photoresist is set on the hot plate and baked at a predetermined temperature within the chamber.

Recently, photolithography has been adapted for use in forming micro patterns on a wafer. In such applications, the extent to which the bake temperature is maintained throughout the bake process, i.e., the bake temperature uniformity, has a large affect on the photolithography or etching process. In other words, maintaining the temperature of the photoresist constant during the bake process is becoming more and more important in the manufacturing of semiconductor devices.

More specifically, the speed at which the temperature of a wafer can be raised to the bake temperature once the wafer is transferred into the chamber of the bake apparatus, and the extent to which the bake temperature can be maintained uniform, are factors that directly affect the production yield of semiconductor devices. Thus, the bake apparatus should be capable of quickly raising the temperature of the wafer and of precisely controlling the temperature of the wafer during the bake process.

FIG. 1 illustrates conventional bake apparatus for baking a typical semiconductor wafer.

The bake apparatus includes a chamber 100, a hot plate 102 installed within the chamber 100, and a buffer plate 108 that is disposed at an upper part of the chamber 100 and has two discharge holes 110 extending therethrough. A wafer 106 is mounted on the hot plate 102, and the hot plate 102 heats the wafer 106 to a predetermined temperature and thereby bakes a photoresist layer on the wafer 106.

Also, the bake apparatus has an air injection passage 104 through which a predetermined quantity of gas (air) is injected into the chamber 100. The gas is pre-heated to predetermined temperature appropriate for the bake process. The buffer plate 108 uniformly disperses the gas within the chamber 100. In addition, the bake apparatus has an exhaust passageway 112 through which the gas is exhausted to the outside via the discharge holes 110 of the buffer plate 108. The buffer plate 108 is circular. The discharge holes 110 have the same diameter and are disposed at the same distance from the center of the circular buffer plate 108.

Also, support pins (not shown) extend from an upper surface of the hot plate 102. These pins support the wafer 106 horizontally above the upper surface of the hot plate 102 so that the hot plate 102 is not in direct contact with the wafer 106.

In the conventional bake apparatus, the gas adjacent the portion of the buffer plate 108 where the discharge holes 110 are present is exhausted quickly, whereas the gas adjacent the other portions of the buffer plate 108 is exhausted slowly. In other words, the gas is not exhausted uniformly from the chamber 100. This causes variations in the thickness of the layer of photoresist which, in turn, results in defects in the pattern formed using the patterned photoresist layer as an etch mask. In particular, a pattern having an unsatisfactory critical dimension (CD) is formed on the wafer.

SUMMARY OF THE INVENTION

Accordingly, an object of the present invention is to provide bake apparatus for use in a spin-coater, which is capable of uniformly exhausting air from the chamber of the apparatus.

According to an aspect of the invention, the bake apparatus includes a chamber, a hot plate installed within the chamber, and at least one buffer plate disposed in an upper part of the chamber and having discharge holes configured so that gas will be discharged uniformly from the chamber. The gas is injected into the chamber through an air injection passageway. The gas is exhausted to the outside via an exhaust opening. The at least one buffer plate is interposed between the hot plate and the location at which the exhaust opening communicates with the interior of the chamber.

Preferably, the discharge holes are arranged in a series of concentric circles whose centers coincide at a central portion of the buffer plate. The innermost circle extends over a central portion of the hot plate, and an outermost one of the circles extends over an outer peripheral portion of the hot plate. The discharge holes preferably span the entire area above the hot plate and hence, a wafer when the wafer is supported on the hot plate.

According to another aspect of the invention, the bake apparatus includes a chamber, a hot plate installed within the chamber, and first and second buffer plates disposed within an upper part of the chamber. The first buffer plate disposed has a plurality of discharge holes therethrough such that gas is uniformly dispersed by the first buffer plate within the chamber is discharged through the discharge holes. The second buffer plate is disposed within the chamber above the first buffer plate and has a plurality of discharge holes therethrough. Thus, the second buffer plate uniformly disperses gas in the space between the first and second buffer plates. The discharge holes are arranged so that the gas is discharged uniformly from the chamber.

Preferably, the discharge holes of the second buffer plate are laterally offset relative to the discharge holes of the first buffer plate so as to not directly overlie the discharge holes of the first buffer plate.

BRIEF DESCRIPTION OF THE DRAWINGS

The present invention will become more fully understood from the detailed description of the preferred embodiments thereof given hereinbelow with reference to the accompanying drawings, wherein.

DETAILED DESCRIPTION OF THE PREFERED EMBODIMENTS

Bake apparatus for use in a spin-coater according to the present invention will be described in detail with reference to FIG. 2. For purposes of clarity, though, a detailed description of known functions and systems associated with bake apparatus in general has been omitted.

Figure 1:
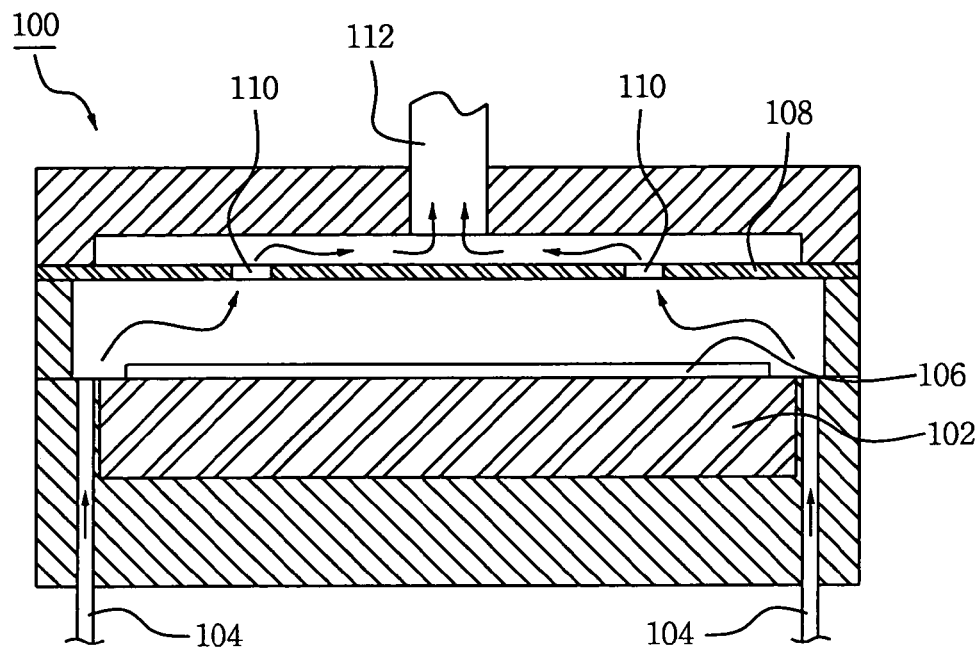
FIG. 1 is a sectional view of conventional bake apparatus for use in a spin-coater of semiconductor device manufacturing equipment.
Figure 2:
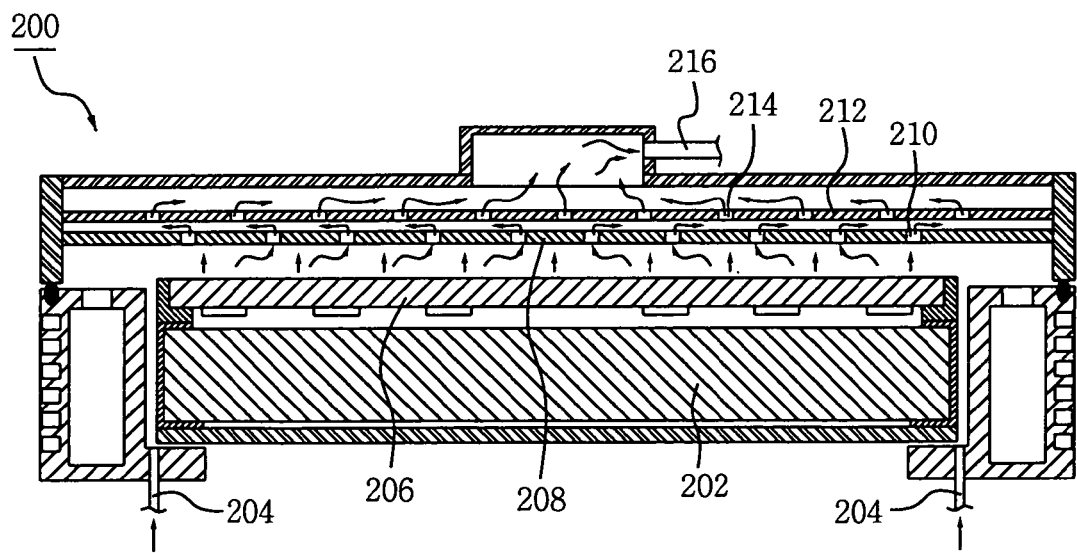
FIG. 2 is a sectional view of bake apparatus for use in a spin-coater according to the present invention.

Referring to FIG. 2, the bake apparatus includes a cylindrical chamber 200, a hot plate 202 installed within the chamber 200, a first circular buffer plate 208 disposed within an upper part of the chamber 200, and a second circular buffer plate 212 disposed within the upper part of the chamber 200 at a predetermined distance above the first buffer plate 208. A wafer 206 is mounted on the hot plate 202, and the hot plate 202 heats the wafer 206 to predetermined temperature and thereby bakes a photoresist layer on the wafer 206.

In addition, the bake apparatus has an air injection passageway 204 for injecting a predetermined quantity of gas (air) into the chamber 200. The first buffer plate 208 uniformly disperses the gas, that has been injected through the air injection passageway 204, within the chamber 200. Also, the first buffer plate 208 has numerous discharge holes 210 extending therethrough. Likewise, the second buffer plate 212 has numerous discharge holes 214 extending therethrough. The second buffer plate 212 uniformly disperses gas discharged through the numerous discharge holes 210 of the first buffer plate 208, and uniformly discharges the gas from the space between the first and second buffer plates 208 and 212. The chamber 200 of the bake apparatus has an air exhaust opening 216 through which the gas discharged through the holes 210 of the second buffer plate 212 is then exhausted to the outside.

The operation of the bake apparatus will now be described in more detail.

Gas is pre-heated to predetermined temperature appropriate for the bake process, and the heated gas is supplied into the chamber 200 through the air injection passageway 204.

A wafer 206 is transferred to the hot plate 202. That is, as shown in FIG. 2, the wafer 206 is supported horizontally on support pins above the upper surface of the hot plate 202. Accordingly, the hot plate 202 does not contact the wafer 206.

The hot plate 206 is operated to radiate heat and thereby bake the wafer 206 and hence, the layer of photoresist thereon. The heated gas injected into the Chamber 200 through the air injection passageway envelops the wafer 206 and thereby maintains the temperature of the wafer 206. The gas is continuously supplied and exhausted through the discharge holes 210 of the first buffer plate 208 and the discharge holes 214 of the second buffer plate 212. The gas discharged through the discharge holes 214 of the second buffer plate 212 is exhausted to the outside through the air exhaust opening 216.

The discharge holes 210 of the first buffer plate 208 do not directly overlie the discharge holes 214 of the second buffer plate 212, but are laterally offset therefrom. Also, the discharge holes 210 and 214 have the same diameter in each of the plates. The discharge holes 210 and 214 are present throughout the entire area of the upper part of the chamber 200 that spans the hot plate 202 and wafer 206. Preferably, the discharge holes 210 and/or 214 are arranged in a series of concentric circles from a central location above the center of the hot plate 202 to a peripheral location above the outer periphery of the hot plate 202. The innermost circle extends over a central portion of the hot plate, and an outermost one of the circles extends over an outer peripheral portion of the hot plate. Also, one of the discharge holes, such as a discharge hole 214 of the second buffer plate 212, may lie directly over the center of the hot plate 202. Accordingly, the discharge holes discharge the gas uniformly from the chamber 200. As a result, the layer of photoresist on the wafer 206 will have uniform characteristics, e.g., a uniform thickness, across the wafer. Hence, the baked photoresist can be used to form a pattern having a desired CD on the wafer 206.

Finally, modifications and variations of the present invention will be apparent to those skilled in the art. For example, although the present invention has been described as having first and second buffer plates 210 and 212, only one such buffer plate may be employed. Accordingly, changes to and modifications of the preferred embodiments are seen to be within the true spirit and scope of the invention as defined by the appended claims.

What is claimed is:

1. Bake apparatus for use in baking a substrate, comprising:
   a chamber;
   a hot plate disposed within the chamber;
   an air injection passageway communicating with the interior of the chamber such that gas can be injected therethrough into the chamber;
   an air exhaust opening communicating with the interior of the chamber at an upper part thereof and through which gas is exhausted from the chamber to the outside; and
   a first buffer plate disposed within the chamber at the upper part thereof as interposed between the hot plate and the location at which the exhaust opening communicates with the interior of the chamber, the first buffer plate having a plurality of discharge holes therethrough such that gas within the chamber is exhausted through the exhaust opening via the discharge holes, and respective ones of the discharge holes lying along each of a series of concentric circles whose centers coincide at a central portion of the buffer plate.

2. The apparatus of claim 1, further comprising a second buffer plate, the second buffer plate disposed within the chamber at the upper part thereof as spaced above the first buffer plate and interposed between the first buffer plate and the location at which the exhaust opening communicates with the interior of the chamber, the second buffer plate having a plurality of discharge holes therethrough such that gas within the chamber is exhausted through the exhaust opening via the discharge holes of the second buffer plate.

3. The apparatus of claim 2, wherein all of the discharge holes of the second buffer plate are laterally offset relative to each of the discharge holes of the first buffer plate so that none of the discharge holes of the second buffer plate directly overlie any of the discharge holes of the first buffer plate.

4. The apparatus of claim 1, wherein an innermost one of the circles along which some of the discharge holes lie extends over a central portion of the hot plate, and an outermost one of the circles along which some of the discharge holes lie extends over an outer peripheral portion of the hot plate.

5. Bake apparatus for use in baking a substrate, comprising:
a chamber;
a hot plate disposed within the chamber;
an air injection passageway communicating with the interior of the chamber such that gas can be injected therethrough into the chamber;
an air exhaust opening communicating with the interior of the chamber at an upper part thereof and through which gas is exhausted from the chamber to the outside;
a first buffer plate disposed within the chamber at the upper part thereof as interposed between the hot plate and the location at which the exhaust opening communicates with the interior of the chamber, the first buffer plate having a plurality of discharge holes therethrough such that gas within the chamber is discharged through the discharge holes; and
a second buffer plate disposed within the chamber at the upper part thereof as spaced above the first buffer plate and interposed between the first buffer plate and the location at which the exhaust opening communicates with the interior of the chamber, the second buffer plate having a plurality of discharge holes therethrough such that gas within the chamber is exhausted through the exhaust opening via the discharge holes of the second buffer plate.

6. The apparatus of claim 5, wherein all of the discharge holes of the second buffer plate are laterally offset relative to each of the discharge holes of the first buffer plate so that none of the discharge holes of the second buffer plate directly overlie any of the discharge holes of the first buffer plate.

* * * * *